(12) United States Patent
Heitmann et al.

(10) Patent No.: US 10,661,198 B2
(45) Date of Patent: May 26, 2020

(54) CRYSTALLIZER OR REACTOR AND METHOD FOR CONTINUOUSLY GROWING CRYSTALS OR CONTINUOUSLY MANAGING A REACTION

(71) Applicants: Torsten Heitmann, Lörrach (DE); Andreas Wilk, Lörrach (DE)

(72) Inventors: Torsten Heitmann, Lörrach (DE); Andreas Wilk, Lörrach (DE)

(*) Notice: Subject to any disclaimer, the term of this patent is extended or adjusted under 35 U.S.C. 154(b) by 70 days.

(21) Appl. No.: 15/747,854

(22) PCT Filed: Jul. 26, 2016

(86) PCT No.: PCT/EP2016/001292
§ 371 (c)(1),
(2) Date: Jan. 26, 2018

(87) PCT Pub. No.: WO2017/016659
PCT Pub. Date: Feb. 2, 2017

(65) Prior Publication Data
US 2019/0009189 A1    Jan. 10, 2019

(30) Foreign Application Priority Data
Jul. 29, 2015  (DE) .................. 10 2015 009 754

(51) Int. Cl.
*B01J 19/00* (2006.01)
*B01J 19/20* (2006.01)
(Continued)

(52) U.S. Cl.
CPC ......... *B01D 9/0009* (2013.01); *B01D 9/0004* (2013.01); *B01D 9/0013* (2013.01);
(Continued)

(58) Field of Classification Search
CPC .. B01D 9/0009; B01D 9/0031; B01D 9/0013; B01D 9/0004; B01J 19/0086;
(Continued)

(56) References Cited

U.S. PATENT DOCUMENTS 2,624,552 A    1/1953  Rose
2,995,016 A *  8/1961  Gold .................... A23L 2/12
                                                     62/541
(Continued)

FOREIGN PATENT DOCUMENTS

AT    510487 A1    4/2012
DE    3111320 A1   9/1982
(Continued)

*Primary Examiner* — Sean E Conley
*Assistant Examiner* — Brendan A Hensel
(74) *Attorney, Agent, or Firm* — Dilworth & Barrese, LLP

(57) ABSTRACT

The invention relates to a processing device in the form of a crystallizer or reactor comprising a tube, at the opposite end regions of which an inlet and an outlet are provided for a crystallization or reaction medium. A helixical web is provided which runs about a longitudinal axis of the tube and which rests against the inner face of the tube casing, and the web is mounted so as to be rotatable about the aforementioned longitudinal axis of the tube. The device also has a drive for rotating the web.

21 Claims, 8 Drawing Sheets

(51) Int. Cl.
*B01J 19/28* (2006.01)
*B01D 9/00* (2006.01)
*C30B 7/08* (2006.01)
*C30B 7/14* (2006.01)
*B01J 4/00* (2006.01)

(52) U.S. Cl.
CPC ............ *B01D 9/0031* (2013.01); *B01J 4/002* (2013.01); *B01J 4/007* (2013.01); *B01J 19/006* (2013.01); *B01J 19/0066* (2013.01); *B01J 19/0086* (2013.01); *B01J 19/20* (2013.01); *B01J 19/28* (2013.01); *C30B 7/08* (2013.01); *C30B 7/14* (2013.01); *B01J 2219/0009* (2013.01); *B01J 2219/00164* (2013.01); *B01J 2219/00166* (2013.01); *B01J 2219/00189* (2013.01)

(58) Field of Classification Search
CPC ...... B01J 19/0066; B01J 19/006; B01J 4/007; B01J 4/002; B01J 19/28; B01J 19/20; B01J 2219/00164; B01J 2219/00189; B01J 2219/00166; B01J 2219/0009; C30B 7/14; C30B 7/08
See application file for complete search history.

(56) References Cited

U.S. PATENT DOCUMENTS

| | | | |
|---|---|---|---|
| 3,595,625 A | | 7/1971 | McNichol |
| 3,652,230 A | * | 3/1972 | Girling ................ B01D 9/0013 422/251 |
| 3,675,902 A | * | 7/1972 | Marshall ................. B01F 7/246 366/307 |
| 2005/0034972 A1 | * | 2/2005 | Lautenschlager ....... B01F 7/008 204/157.43 |
| 2009/0012649 A1 | * | 1/2009 | Strand ........................ B01J 4/00 700/271 |
| 2014/0234177 A1 | | 8/2014 | Hongu et al. |
| 2016/0354750 A1 | * | 12/2016 | Beni ..................... B01F 7/1685 |

FOREIGN PATENT DOCUMENTS

| | | |
|---|---|---|
| DE | 10016011 A1 | 10/2001 |
| DE | 10225075 A1 | 11/2003 |
| DE | 102005009322 A1 | 9/2006 |
| DE | 102008058313 A1 | 6/2010 |
| GB | 491945 A | 9/1938 |
| GB | 2031297 A | 4/1980 |
| WO | 8700079 A1 | 1/1987 |

* cited by examiner

CRYSTALLIZER OR REACTOR AND METHOD FOR CONTINUOUSLY GROWING CRYSTALS OR CONTINUOUSLY MANAGING A REACTION

BACKGROUND OF THE INVENTION

The invention relates to an apparatus that can be used as a crystallizer, on the one hand, and in the same way, on the other hand, as a reactor for carrying out chemical reactions. The invention further relates to a use of such an apparatus. To the extent it is performed as a crystallizer, it relates to the use of the crystallizer for growing crystals and to a method for continuously growing crystals.

The growing of crystals from a fluid crystallization medium such as a solution or a melt is required in a plurality of industrial applications. The growing of crystals typically takes place in discontinuous processes that are associated with an increased effort of time and costs.

SUMMARY OF THE INVENTION

The aim of the invention is to provide a crystallizer with the help of which the growing of crystals can take place within the framework of a continuous process. At the same time, it is the aim of the invention to provide a reactor in which the reaction can be carried out continuously.

Against this background, the invention relates to a process apparatus in the form of a crystallizer or reactor comprising a tube, at the opposite end regions of which an inflow and an outflow are provided for a crystallization or reaction medium, wherein a web is provided which runs helically about a longitudinal axis of the tube and which rests against the inner face of the tube jacket, and the web is mounted so as to be rotatable about the aforementioned longitudinal axis of the tube and wherein the apparatus also has a drive for rotating the web.

The tube is preferably circular in cross-section. The axis of rotation corresponds to said longitudinal axis of the tube and preferably extends at the center of the circle formed in cross-section.

Suitable drives include motors such as electric motors.

The installation position of the tube can be either horizontal or sloped.

The tube and/or the web are preferably produced from weldable materials such as metal or plastic. Materials such as glass, carbon, fiber reinforced plastics or ceramics—such as enamel—are also suitable for use. In an embodiment, the inner side of the tube jacket and/or the web is/are coated, for example with a corrosion-resistant material such as Teflon.

In an embodiment, the web is fixedly connected to the inner side of the tube jacket. The web can, for example, be welded or adhesively bonded to the inner side of the tube jacket.

In an embodiment, the tube is supported such that it can be rotated about said longitudinal axis together with the web. In this case, the rotatable support of the tube represents the rotatable support of the web and serves for the drive to rotate the tube.

In an embodiment, the web and the tube represent separate components.

In an embodiment, the tube is supported in a stationary and not in a rotatable manner. The web can, for example, contact the inner side of the tube jacket and can be driven with the aid of a separate axle. Provision is preferably made here that the web contacts the inner side of the tube jacket in a fluid-tight manner.

In an embodiment, the end of the tube at the outflow side is closed. The closing can, for example, take place using a cover.

In an embodiment, the tube jacket has one or more apertures distributed over the periphery in the end region at the outflow side. The apertures enable an outflow of the crystallization or reaction medium from the tube interior. They can be distributed evenly over the periphery of the tube and/or can all be arranged at the same length position of the tube. The apertures are, for example, circular bores.

A collector such as a static collector and/or separation apparatus such as centrifuges, filters and/or decanters can adjoin the outflow.

In an embodiment, the end of the tube at the outflow end has an access opening. The access opening enables an inflow of the crystallization medium into the tube interior. The end of the tube at the inflow side can either be without a cover or can be provided with a cover that has an access opening. Provision can, for example, be made that a cover at the inflow side forms a dam extending along the jacket surface of the tube and has an access opening at the center. The dam is preferably of the same height as or higher than the helical web at all points. The access opening can, for example, be circular, with the center of the circle being able to correspond to the axis of rotation of the tube.

The inflow can comprise a line that projects into the tube at the end of the tube at the inflow side. The inflow is preferably supported in a stationary, i.e. non-rotatable, manner so that it is not rotated along with the tube in operation of the crystallizer.

In an embodiment, the crystallizer or the reactor comprises at least one lance that projects into the tube interior in the axial direction from one end of the tube and preferably starting from the end of the tube at the inflow side. The lance has at least one sensor and/or at least one actuator.

The actuator can, for example, be a means for dispensing liquid such as a nozzle or the like. The lance can be supported such that it can be moved in an axial direction. It is thus possible to pull the lance out of the tube interior, to introduce it into the tube interior and to move it in the axial direction within the tube interior. Alternatively or additionally, the lance can be supported such that it can be moved in the radial direction. A pivot support of the lance can, for example, be provided so that the lance can be tilted out of the axial direction and so that the tip of the lance can thus be raised. It is thus possible to move the sensors or actuators located at the lance in a vertical direction and to raise the sensor, for example at periodic intervals, to avoid a collision with the web being displaced by the rotation of the tube. The lance is preferably supported in a stationary, i.e. no-rotatable, manner so that it is not rotated along with the tube in operation of the crystallizer or reactor.

A plurality of lances can also be provided to satisfy different functions. A sensor lance having a sensor such as a pH sensor, a conductivity sensor, or an opacity sensor can, for example, be provided. A metering lance having a liquid channel and at least one nozzle can furthermore be provided, for example, to be able to add liquid by metering at a specific length position of the tube. A washing lance having a liquid channel and at least one nozzle can furthermore be provided, for example, to be able to flush or clean the tube.

In an embodiment, the tube jacket has a chamber for a temperature control medium. Provision is, for example, made that a channel, that can e.g. extend helically, is attached to the outer side of the tube jacket. The channel can, for example, be a half-pipe coil that is attached, for example adhesively bonded or welded to the outer side of the tube.

Alternatively, the tube jacket can be configured with double walls at least sectionally and the chamber is formed by the intermediate space of the two walls.

In an embodiment, the helically extending web is interrupted or is reduced in height for at least a segment. This segment can, for example, extend over 0.25 to 2, or preferably over 0.75 to 1.25, lead lengths of the helix. It can thus be made possible that a sensor or actuator located at a lance can be immersed into the crystallization medium in the region of this segment without having to be raised periodically or without colliding with the web.

In an embodiment, the crystallizer or reactor includes an encapsulation that completely surrounds the tube. Provision can be made here that the encapsulation is gas-tight and/or pressure-tight. A pressure sensor can, for example, be present for monitoring the inner pressure of the encapsulation.

In an embodiment, the crystallizer or reactor has a pressure pump and/or a venting valve for setting a pressure within the encapsulation.

In an embodiment, the crystallizer or reactor has a conveying system for providing an industrial gas atmosphere within the encapsulation. Suitable industrial gases comprise inert gases such as nitrogen, for example.

The individual values for dimensions of the crystallizer or reactor, web height, lead length of the helix, and the chamber volume largely depend on the application. Exemplary values include tube diameters of between 1 and 3 m, tube lengths of between 1 and 5 m, web heights of between 10 and 140 cm, lead lengths of between 5 and 50 cm, and chamber volumes of 2 to 1600 L.

Provision is, however, preferably made that the web height amounts to between 10% and 40%, and preferably to between 20% and 30%, of the tube diameter. Provision is furthermore preferably made that the lead angle of the helix amounts to between 0.5 and 5° and preferably to between 1° and 3°.

Against the initially named background, the invention further relates to the use of a crystallizer for growing crystals in accordance with the invention.

The invention furthermore relates to a method for growing crystals as part of a continuous process using a crystallizer in accordance with the invention. As part of this method, crystallization medium is continuously added to the tube through the inflow and flows off continuously through the outflow. The web helix is preferably rotated continuously. In the same manner, the invention relates to a method for carrying out a continuous reaction.

The rotation of the web helix can take place together with the rotation of the tube or individually, i.e. without a simultaneous rotation of the tube. After running through the tube, the crystallization medium (with suspended crystals) can be collected and centrifuged, filtered and/or decantered.

The rotational speed of the helix, the throughput, and the dwell time of the crystallization medium largely depend on the application. Exemplary values include rotational speeds of greater than 0 and 1 r.p.m., preferably between 0.3 and 0.5 r.p.m.; throughputs of 0.5 to 100 $m^3/h$; and dwell times of between 1 minute and 10 hours.

The tube can be either horizontal or sloped during the carrying out of the method.

Further substances can selectively be added or measurements carried out at specific length positions with reference to any lances present. A pH measurement can, for example, take place by a pH probe fastened to a lance and dipped into the medium. Provision can be made that the lance is raised and lowered regularly in accordance with the rotational frequency to allow a web to pass and then to again dip the probe into the medium.

The apertures in the end region of the tube at the outflow side enable an outflow of the crystallization medium (with suspended crystals) from the tube interior, for example under the effect of gravity.

The tube can, for example, be cleaned by flushing, with provision being able to be made that the flushing takes place using a washing lance.

Provision is made in an embodiment that the capsule is subjected to excess pressure during the carrying out of the method and/or is filled with an industrial gas atmosphere. Suitable industrial gases include inert gases such as nitrogen.

The tube can be temperature controlled to temperatures of, for example, between −80° C. and 200° C. Temperature control liquid can e.g. be circulated in the chamber provided at the tube jacket for the temperature control.

BRIEF DESCRIPTION OF THE DRAWINGS

Further details and advantages of the invention result from the embodiments discussed in the following with reference to the Figures. There are shown in the Figures.

DESCRIPTION OF THE PREFERRED EMBODIMENTS

Figure 1:
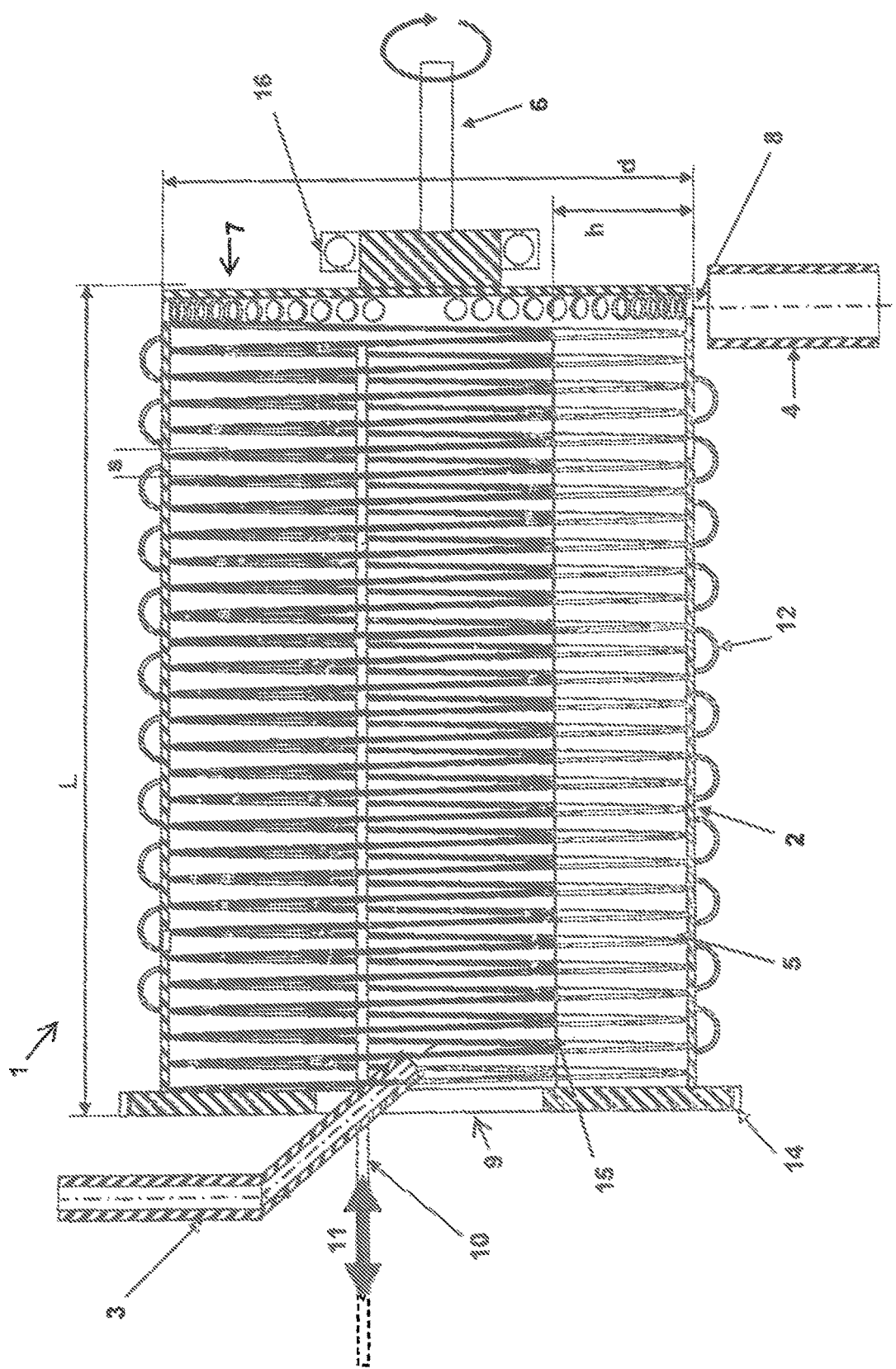
FIG. 1: a longitudinal section through a first embodiment of a crystallizer in accordance with the invention.

A first embodiment of a process apparatus in accordance with the invention is shown in FIG. 1 in the form of a crystallizer 1 in a longitudinal section.

The crystallizer 1 has a tube 2 that has a circular cross-section and that can be rotated about is longitudinal axis disposed at the circle center. A inflow 3 and an outflow 4 for a crystallization medium are provided at the oppositely disposed end regions of the tube 2. A web 5 that extends helically about the axis of rotation of the tube is welded to the inner side of the tube jacket. The tube and the web are produced from steel. A drive rod 6 is provided at the end of the tube at the outflow side; it is disposed in the axis of rotation and connected to a suitable drive means such as an electric motor.

In the illustration shown, the installation position of the tube 1 is horizontal. Provision can, however, be made that the tube is sloped in operation.

The end of the tube 2 at the outflow side is closed using the cover 7. A plurality of bores distributed evenly over the periphery are worked into the jacket of the tube 2 close to the cover and enable an outflow of the crystallization medium from the tube interior in operation of the crystallizer. The bores are all arranged on the same length position of the tube, i.e. at the same spacing from the tube ends.

A static collector, not shown in any more detail in the Figure, adjoins the outflow 4. A centrifuge, not shown in any more detail in the Figure, adjoins the collector.

A cover 13 is provided at the end of the tube 2 at the inflow side; its forms a dam extending along the jacket surface of the tube 2 and has an access opening 9 at the center. The dam is annular and the access opening is circular. The circle center is disposed at the axis of rotation of the tube. The access opening 9 enables an inflow of the crystallization medium into the tube interior. The inflow 3 comprises a line that projects into the tube 2 through this opening 9 at the end of the tube 2 at the inflow side. The inflow 3 is supported in a non-rotatable manner and is not rotated along with the tube in operation of the crystallizer.

The crystallizer 1 furthermore comprises an axially extending lance 10 that projects through the access opening 9 into the tube interior. The lance 10 can have a sensor or actuator not shown in any more detail in FIG. 1. The lance can be displaced in the horizontal direction 11.

A half-pipe coil 12 of steel is welded to the outer side of the tube jacket; it extends helically like the web and serves the temperature control of the tube jacket in that cooling liquid or heating liquid can be circulated through the half-pipe coil 12. The supply of the liquid cooling medium or heating medium can take place via the shaft at the outflow side.

The tube 2 is rotatably supported on a ball bearing or on a cylindrical roller bearing 16 on the drive shaft at the outflow side. The container can be supported on the open side at the flange 14 by cylinder rollers, not shown in any more detail in the Figure, in a cage, not shown in any more detail.

In the embodiment shown, the length L of the crystallizer can, for example, amount to 3 m; the pipe diameter d can, for example, amount to 2 m; the web height h can, for example, amount to 50 cm; the lead length s can, for example, amount to 10 cm; and the chamber volume can, for example, amount to 61 l.

On the carrying out of a crystallization method in accordance with the invention at the crystallizer 1 shown in FIG. 1, crystallization medium is continuously added through the inflow 3 into the tube 2, continuously passes through the tube 2, and continuously flows through the outflow 4 under the effect of gravity. After flowing out, the crystallization medium (with suspended crystals) is collected and centrifuged.

The web helix is rotated continuously here. The conveying of the crystallization medium through the tube is based on the principle of Archimedes' screw. The chambers formed between the webs are continuously displaced by rotation of the helix from the end region at the inflow side to the end region at the outflow side of the tube 2 and thus provide a slow conveying of the crystallization medium through the tube. The crystal formation takes place within these chambers during the translation of the chambers through the tube interior.

The maximum level 15 of the crystallization medium corresponds to the web height h.

The rotational speed of the helix can, for example, amount the 0.3 r.p.m.; the throughput can, for example, amount to 1.11 m$^3$/h; and the dwell time can, for example, amount to 100 min. The rotational speed is kept constant, with a briefly higher input volume flow resulting in an slopping over of the crystallization medium onto the surrounding chambers. The last chamber runs empty on reaching a bore 8.

Due to the hydraulic design of the system, the flow at the slope corresponds to a channel flow and Reynolds numbers of at least 100,000 are reached. A particular advantage can be found in the gentle treatment of the crystallizate, whereby the method is suitable for growing needle crystals or sensitive crystals. High viscosities can also be handled without difficulty.

Figure 2:
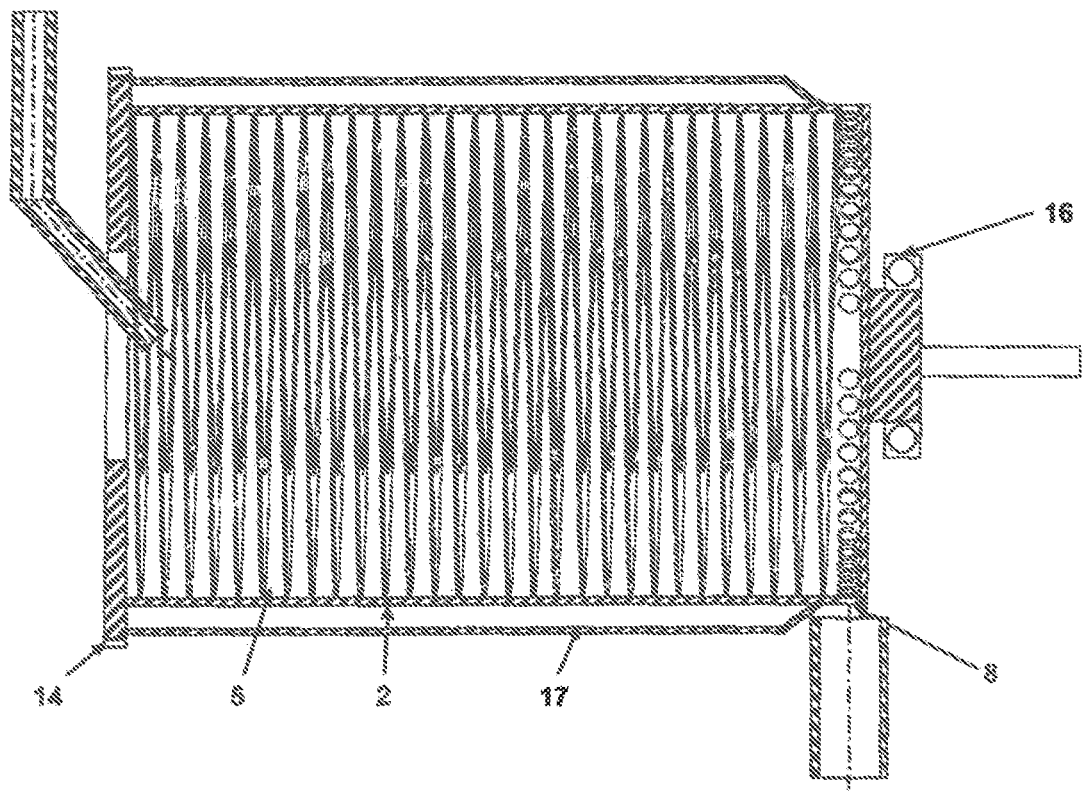
FIG. 2: a longitudinal section through a second embodiment of a crystallizer in accordance with the invention.

A further embodiment of a crystallizer 1 in accordance with the invention is shown in longitudinal section in FIG. 2. Unlike the embodiment in accordance with FIG. 1, the half-pipe coil 12 is missing in this embodiment. The tube jacket is designed as double-walled instead. A chamber for a cooling liquid or heating liquid is formed by the intermediate space between the inner wall of the tube jacket and the outer wall 17 of the tube jacket.

Figure 3:
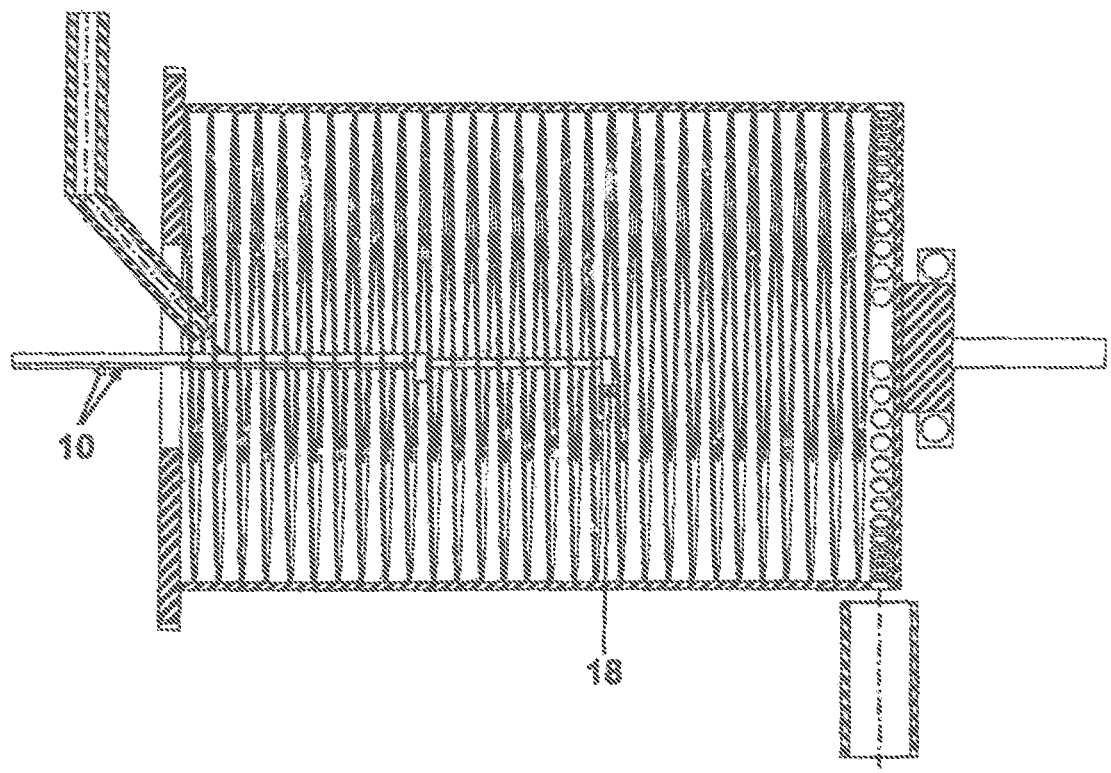
FIG. 3: a longitudinal section through a third embodiment of a crystallizer in accordance with the invention.

A further embodiment of a crystallizer 1 in accordance with the invention is shown in longitudinal section in FIG. 3. In this embodiment, two axially extending metering lances 10 are provided that project through the access opening 9 into the tube interior. A respective nozzle 18 for adding a liquid reagent is present at the tip of both lances 10. The tips of the two lances 10 are arranged at different length positions of the tube. A liquid reagent can thus be metered in at two specific length positions of the tube and thus after a specific dwell time of the crystallization medium in the tube to influence the crystallization process.

Figure 4:
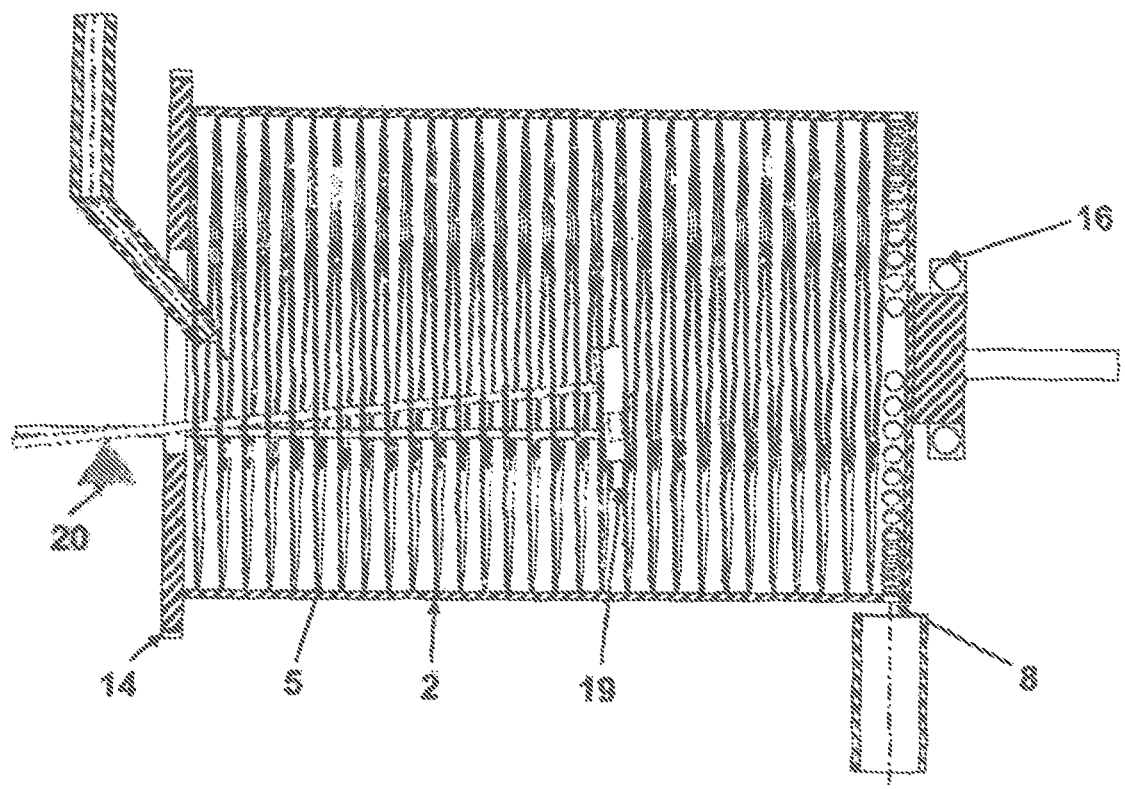
FIG. 4: a longitudinal section through a fourth embodiment of a crystallizer in accordance with the invention.

The embodiment of the crystallizer 1 in accordance with the invention shown in FIG. 4 comprises a measurement lance 10 that likewise extends axially and projects through the access opening 9 into the tube interior. A probe 19 which can be a pH probe is arranged at the tip of the measurement lance 10. This lance is supported at a tilt bearing 20 located outside the tube such that it can be tilted out of the axial direction so that the probe 19 can be raised and lowered. It is thus possible to raise the probe 19 at periodic intervals, for example, to avoid a collision with the web 5 being displaced by the rotation of the pipe. In operation, the probe is thus regularly raised in accordance with the rotational frequency of the tube 2 or of the helix 5 to allow a web 5 to pass and is then again lowered into the medium.

Figure 5:
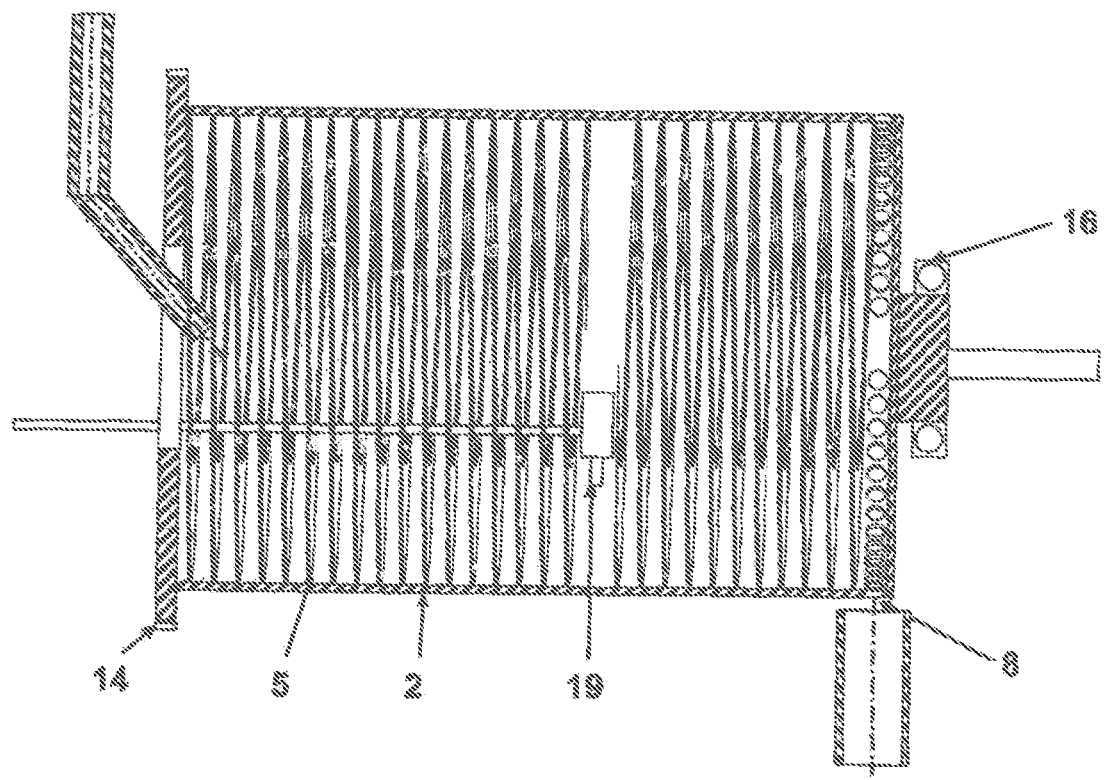
FIG. 5: a longitudinal section through a fifth embodiment of a crystallizer in accordance with the invention.

In the embodiment of the crystallizer 1 in accordance with the invention shown in FIG. 5, the tilt bearing of the measurement lance 10 is missing so that it cannot be tilted out of the axial direction at periodic intervals. To avoid a collision with the web 5, provision is instead made that the helically extending web 5 is, interrupted in that section in which the probe 19 is dipped into the crystallization medium. The section extends in the embodiment shown over exactly one lead length s, with the ideal length of the section depending on the design of the probe 19. The interruption results in a somewhat wider dwell time distribution of the crystallization medium, which can, however, be accepted in the observed degree.

Figure 6:
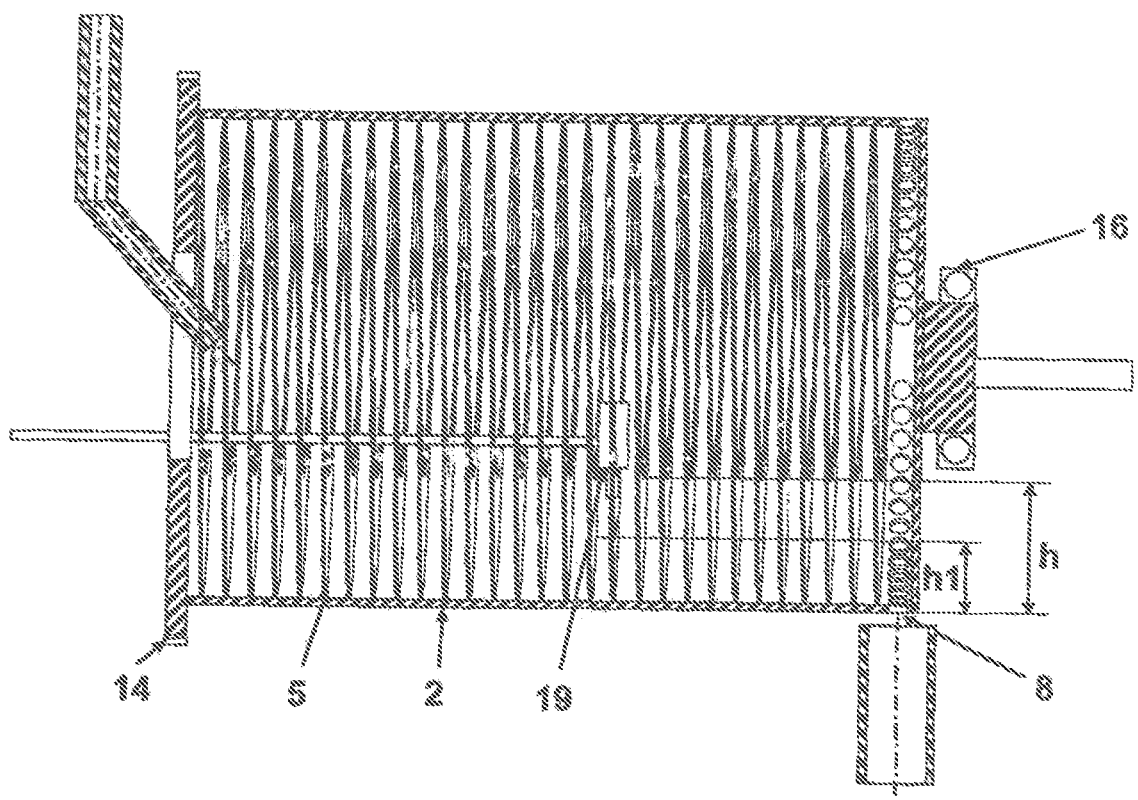
FIG. 6: a longitudinal section through a sixth embodiment of a crystallizer in accordance with the invention.

In the embodiment of the crystallizer 1 in accordance with the invention shown in FIG. 6, the helically extending web 5 is not interrupted in that section in which the probe 19 is dipped into the crystallization medium, but is only reduced in height. The height-reduced section also extends over exactly one lead length here and the ideal length of the section also depends on the design of the sensor head here. A wider dwell time distribution of the crystallization medium is likewise observed; however, to a somewhat smaller degree than with a complete interruption of the helix 5. The selected height h1 of the height-reduced section depends on the design of the sensor 19 and on the desired measurement depth. The reduced height h1 can, for example, amount to between 30% and 60% of the total height h. In absolute numbers, a reduced height h1 of, for example, 20 cm is conceivable.

Figure 7:
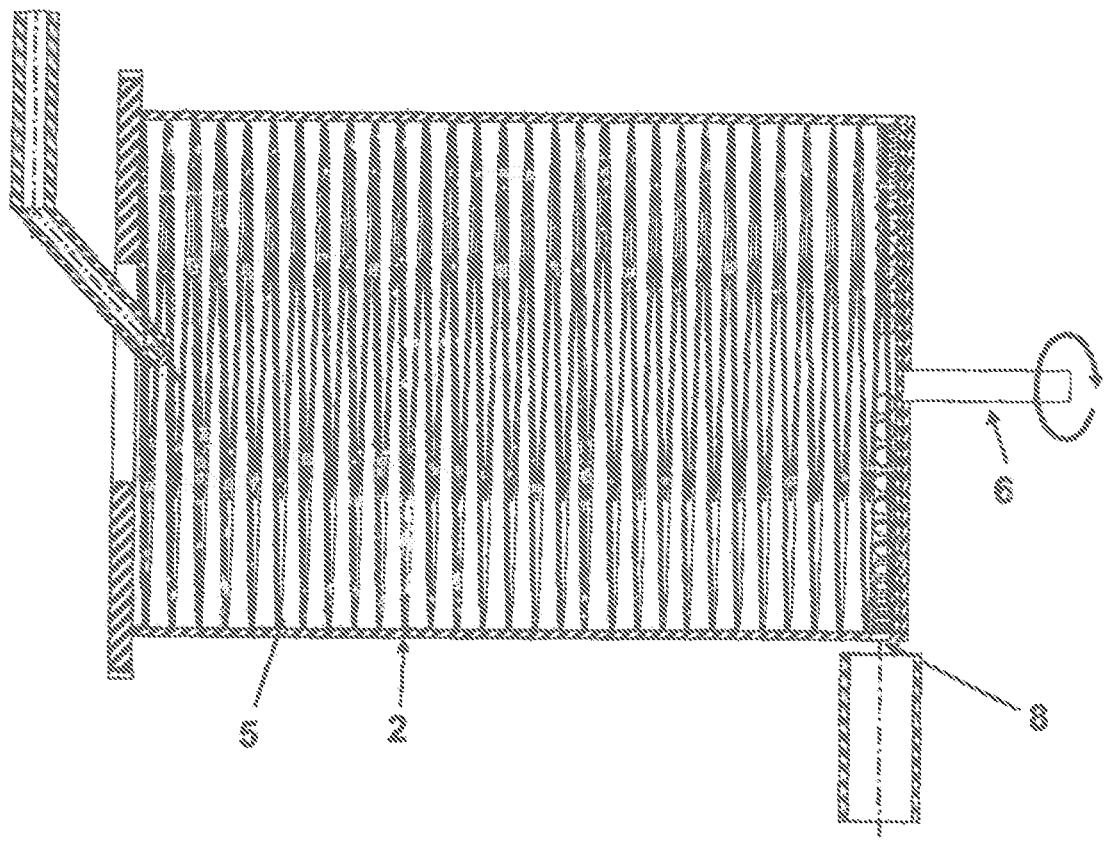
FIG. 7: a longitudinal section through a seventh embodiment of a crystallizer in accordance with the invention.

The embodiment of the crystallizer 1 in accordance with the invention shown in FIG. 7 differs from the embodiments in accordance with FIGS. 1 to 6 in that in this embodiment the tube 2 is supported in a stationary manner and only the helix 5 is rotatably supported within the tube 2. Only the helix 5 therefore rotates within the fixed-position tube 2 during the carrying out of a continuous crystallization process while using this crystallizer 1. In this embodiment, the helix 5 is therefore not fixedly connected to the tube 2, but is rather placed into the tube 2. The dimensions of the helix 5 and of the tube 2 are selected such that the outer diameter of the helix 5 exactly corresponds to the inner diameter of the tube 2 and the helix 5 is thus received in the tube 2 with an exact fit. It is thus avoided that a broadening of the dwell time distribution occurs due to an intermediate space between the tube jacket and the webs 5. The drive 6 in this embodiment is not connected to the tube, but rather directly to the helix 5 using a drive disc located at the end of the tube 2 at the outflow side. A rotational support of the tube 2 such as has been described in connection with the embodiment in accordance with FIG. 1 is missing in this embodiment.

Figure 8:
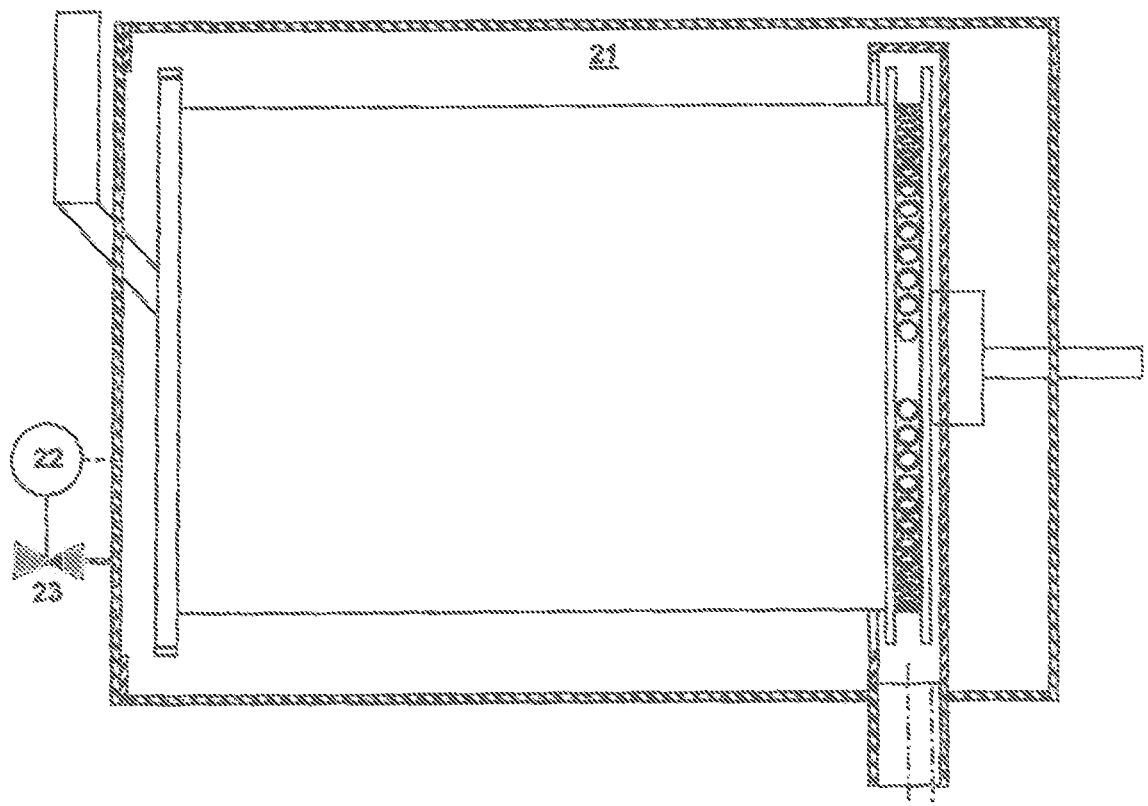
FIG. 8: a longitudinal section through an eighth embodiment of a crystallizer in accordance with the invention.

FIG. 8 shows an embodiment of the crystallizer 1 in accordance with the invention, with the tube 2 being completely received in a pressure-resistant and gas-tight encapsulation 21. The encapsulation 21 can be flushed by an industrial gas such as nitrogen and/or can be exposed to excess pressure or vacuum during the carrying out of a method in accordance with the invention. Gas lines not shown in any more detail in the Figure and pressure and/or evacuation pumps can be provided for this purpose. The encapsulation 21 can, for example, consist of metal or plastic. The encapsulation 21 has bores for the inflow 3 and for the outflow 4. These bores can, as is shown in the Figure in connection with the outflow 4, have collars at both sides, e.g. to guide outflowing crystallization medium. In the embodiment shown, the outflow is at least partly formed by these collars. A pressure measurement device 22 that is coupled to a valve 23 can furthermore be recognized in FIG. 8. A pressure regulation can optionally take place by such an arrangement on the carrying out of the method.

It is possible within the framework of the invention to generate additional turbulence by baffles or welded installations such as tubes or metal sheets installed at the container jacket in the direction of the longitudinal axis.

Industrial examples for the use of the previously described continuous apparatus will be shown in the following that show preferred applications:

1) Crystallization by changing the pH in a mixer:
   The result of a prior reaction or mixture is transformed from a collection tank or from a continuous reactor, for example a tubular reactor, into the state of oversaturation. For this purpose, acid or lye is added to a mixer, for example a simple T segment or to a Venturi intake pipe, and an oversaturation is thus achieved. This mixture is now added at the inlet of the continuous apparatus. Further acid or lye can be added at any desired point in the continuous apparatus. The target pH is measured at a fixed location in the continuous apparatus by a pH probe. Crystallization starts spontaneously or by adding seed crystals. The seed crystals can, for example, be added with the acid or lye or in solid form as a powder or in suspended form in the mixer or at the inlet of the continuous apparatus. At the end of the continuous apparatus, the crystallizate and mother liquor flows or falls through openings, for example, bores, in the drum into the next process step, for example centrifuging or filtration. The desired crystal size should, for example, be reached after 17 minutes. This is achieved with a volume flow of 1 m$^3$/h in a continuous apparatus of, for example, 1.5 m of length and a drum diameter of, for example, 1.0 m, and 50 revolutions an hour. The spacing of the webs in the continuous apparatus amounts to 0.1 m, for example.

2) Crystallization by varying the pH in the continuous apparatus
   In this example, the result of the prior reaction or mixture is added directly at the inlet of the continuous apparatus. In addition, acid or lye is continuously added or admixed. Further acid or lye can be added at any desired point in the continuous apparatus. The target pH is measured at a fixed position in the continuous apparatus using a pH probe. Crystallization starts spontaneously or by adding seed crystals. The seed crystals can, for example, be added with the acid or lye or in solid form as a powder or in suspended form at the inlet of the continuous apparatus. At the end of the continuous apparatus, the crystallizate and mother liquor flows or falls through openings, for example, bores, in the drum into the next process step, for example centrifuging or filtration. The desired crystal size should, for example, be reached after 45 minutes. This is achieved with a volume flow of 0.5 m$^3$/h in a continuous apparatus of, for example, 1.5 m of length and a drum diameter of, for example, 1.0 m, and 20 revolutions an hour. The spacing of the webs in the continuous apparatus amounts to 0.1 m, for example.

3) Crystallization by varying the temperature:
   The result of a prior reaction or mixture is added from a collection tank or from a continuous reactor, for example a tubular reactor, at the inlet of the continuous apparatus. A desired temperature is set in the continuous apparatus through, for example, a half-pipe coil or a double jacket; for example −4° C. using a cooling brine or 16° C. using cooling water, or 130° C. using 16 bar water vapor. The target temperature is measured and controlled either at a stationary position or at the drum jacket.
   The crystallization starts spontaneously or by adding seed crystals. The seed crystals can, for example, be added in solid form as a powder or in suspended form at the inlet of the continuous apparatus.
   At the end of the continuous apparatus, the crystallizate and mother liquor flows or falls through openings, for example, bores, in the drum into the next process step, for example centrifuging or filtration.
   The desired crystal size should, for example, be reached after 60 minutes. This is achieved with a volume flow of 1.5 m$^3$/h in a continuous apparatus of, for example, 2.5 m of length and a drum diameter of, for example, 2.0 m, and 25 revolutions an hour. The spacing of the webs in the continuous apparatus amounts to 0.1 m, for example.
   In addition, temperature profiles can be set over the length of the continuous apparatus.

4) Reaction, adding in a mixer
   The reactants are mixed from collection containers or continuous receivers, for example, in a mixer, or a T piece, or a Venturi intake pipe. Further reactants can be added at any desired point in the continuous apparatus. The temperature required for the reaction is, for example, set using a half-pipe coil or a double jacket in the continuous apparatus; for example −4° C. using a cooling brine; or 16° C. using cooling water; or 130° C. using 16 bar water vapor. The target temperature is measured and controlled either at a stationary position or at the drum jacket. Any reaction heat arising can be dissipated in the same manner.

The reaction is ended at the end of the continuous apparatus by admixing one or more substances or by varying the temperature. The product flows or falls through openings, for example bores, in the drum into the next process step.

The reaction should, for example, be reached after 30 minutes. This is achieved with a volume flow of 0.7 m$^3$/h in a continuous apparatus of, for example, 2.0 m of length and a drum diameter of, for example, 1.0 m, and 18 revolutions an hour. The spacing of the webs in the continuous apparatus amounts to 0.2 m, for example.

Temperature profiles can also be set over the length of the continuous apparatus.

5) Reaction, direct addition

The reactants are added from collection containers or continuous receivers directly at the inlet of the continuous apparatus. Further reactants can be added at any desired point in the continuous apparatus. The temperature required for the reaction is, for example, set using a half-pipe coil or a double jacket in the continuous apparatus; for example −4° C. using a cooling brine; or 16° C. using cooling water; or 130° C. using 16 bar water vapor. The target temperature is measured and controlled either at a stationary position or at the drum jacket. Any reaction heat arising can be dissipated in the same manner.

The reaction can be ended at the end of the continuous apparatus by admixing one or more substances or by varying the temperature. The product flows or falls through openings, for example bores, in the drum into the next process step.

The reaction should, for example, be reached after 10 minutes. This is achieved with a volume flow of 2.4 m$^3$/h in a continuous apparatus of, for example, 2.0 m of length and a drum diameter of, for example, 1.0 m, and 60 revolutions an hour. The spacing of the webs in the continuous apparatus amounts to 0.2 m, for example.

Temperature profiles can also be set over the length of the continuous apparatus.

The invention claimed is:

1. A crystallizer (1) or a reactor, comprising a tube (2), at the opposite end regions of which an inflow (3) and an outflow (4) are provided for a crystallization or reaction medium, wherein
    a web (5) runs helically about a longitudinal axis of the tube (2) and is connected to an inner face of the tube (2) for co-rotation with the tube (2),
    the tube (2) is mounted to rotate together with the web (5) about the longitudinal axis of the tube (2),
    rotatable support of the tube (2) also rotatably supports the web (5),
    the apparatus has a drive (6) configured for rotating the web (5) and the tube (2) together,
    web height (h) amounts to between 10% and 40% of outer tube diameter (d) and/or a lead angle of the helical web amounts to between 0.5 and 5°, and
    installation position of the tube (2) is horizontal or sloped.

2. An apparatus in accordance with claim 1, wherein the web (5) is fixedly connected to the inner face of the tube; and/or the tube (2) is supported such that it can be rotated together with the web (5) about said longitudinal axis, with the rotatable support of the tube (2) representing the rotatable support of the web (5) and with the drive (6) serving the rotation of the tube (2).

3. An apparatus in accordance with claim 1, wherein the web (5) and the tube (2) represent separate components; and/or the tube (2) is supported in a stationary and non-rotatable manner.

4. An apparatus in accordance with claim 1, wherein an end of the tube (2) at the outflow is closed; and/or the tube has at least one aperture.

5. An apparatus in accordance with claim 1, wherein an end of the tube (2) at the inflow side has an access opening (9).

6. An apparatus in accordance with claim 1, wherein the crystallizer (1) comprises at least one lance (10) that projects into the tube interior in an axial direction (11) from an end of the tube (2), with this lance (10) having at least one sensor (19) and/or at least one actuator (18).

7. An apparatus in accordance with claim 1, wherein the tube has a chamber for a temperature control liquid.

8. An apparatus in accordance with claim 1, wherein helically extending web (5) is interrupted for at least one segment or is reduced in height (h).

9. An apparatus in accordance with claim 1, wherein the crystallizer (1) comprises an encapsulation (21) that completely surrounds the tube (2).

10. An apparatus in accordance with claim 9, wherein the crystallizer (1) has a pressure pump and/or a venting valve (23) for setting a pressure within the encapsulation (21), and/or the crystallizer (1) has a conveying system for providing an industrial gas atmosphere within the encapsulation (21).

11. An apparatus in accordance with claim 1, wherein the web height (h) amounts to between 20% and 30% of the tube diameter (d); and/or the lead angle of the helical web amounts to between 1° and 3°.

12. A method for growing crystals as part of a continuous process using a crystallizer (1) in accordance with claim 1, wherein crystallization medium is continuously added into the tube (2) through the inflow (3) and flows out continuously through the outflow (4); and the helical web (5) is continuously rotated together with the tube (2) or without a simultaneous rotation of the tube (2).

13. A method for carrying out a reaction in a continuous process using an apparatus in accordance with claim 1, wherein reaction medium is continuously added into the tube (2) through the inflow (3) and flows out continuously through the outflow (4); and the helical web (5) is continuously rotated together with the tube (2) or without a simultaneous rotation of the tube (2).

14. An apparatus in accordance with claim 4, additionally comprising a cover (7) closing the end of the tube (2) at the outflow.

15. An apparatus in accordance with claim 4, wherein the tube (2) has a plurality of apertures (8) distributed over a periphery in the end region at the outflow.

16. An apparatus in accordance with claim 6, wherein the lance (10) projects from the end of the tube (2) at the inflow.

17. An apparatus in accordance with claim 7, additionally comprising a helically-extending passage (12) attached to an outer face of the tube (2).

18. An apparatus in accordance with claim 7, wherein the tube (2) is at least sectionally double-walled.

19. An apparatus in accordance with claim 8, wherein this segment extends over 0.25 to 2 loops of the web (5).

20. An apparatus in accordance with claim 19, wherein this segment extends over 0.75 to 1.25 loops of the web (5).

21. An apparatus in accordance with claim 9, wherein encapsulation (21) is gas-tight and/or pressure resistant.

* * * * *